United States Patent [19]

Fielding et al.

[11] Patent Number: 4,535,041

[45] Date of Patent: Aug. 13, 1985

[54] STABILIZATION OF HOLOGRAMS

[75] Inventors: Herbert L. Fielding, Wilmington; Richard T. Ingwall, Newton, both of Mass.

[73] Assignee: Polaroid Corporation, Cambridge, Mass.

[21] Appl. No.: 641,994

[22] Filed: Aug. 20, 1984

[51] Int. Cl.$^3$ ............................ G03H 1/04; G03C 5/24
[52] U.S. Cl. ............................................ 430/1; 430/2; 430/17; 430/331; 430/432
[58] Field of Search ............... 430/1, 2, 621, 432, 430/463, 331, 17; 350/3.61

[56] References Cited

U.S. PATENT DOCUMENTS

| 3,582,347 | 6/1971 | Holly et al. | 430/379 |
| 3,658,526 | 4/1972 | Haugh | 430/1 |
| 3,660,091 | 5/1972 | Shankoff et al. | 430/1 |
| 3,694,218 | 9/1972 | Margerum et al. | 430/1 |
| 3,909,267 | 9/1975 | Iwano et al. | 430/372 |
| 3,925,082 | 12/1975 | Fielding et al. | 430/228 |

*Primary Examiner*—Mary F. Downey
*Attorney, Agent, or Firm*—Stanley H. Mervis

[57] ABSTRACT

Volume phase holograms formed by photopolymerization of a polymerizable monomer, e.g., lithium acrylate, exhibit substantially increased retention of diffraction efficiency when exposed to high humidity if they are sequentially treated with a zirconium compound and a fatty acid.

10 Claims, No Drawings

STABILIZATION OF HOLOGRAMS

This application is concerned with photography and, more particularly, with volume phase holograms. This invention provides volume phase holograms which exhibit increased retention of diffraction efficiency when exposed to high humidity.

BACKGROUND OF THE INVENTION

As is well known in the art, volume phase reflection holograms are formed by exposing a photosensitive layer to an actinic interference pattern and developing the exposed photosensitive layer. The wavelength of the light diffracted by the interference fringes recorded in the photosensitive material is determined by the spacing between the fringes. Contact with water, e.g., by being stored under humid conditions, can cause changes in the spacing between the interference fringes. A change in the fringe spacing will cause a change in diffraction angle. For a reflection hologram, if the change in spacing is great enough, a wavelength shift could result which is great enough to cause the wavelength reflected to be different from that which is desired. In extreme cases, the moisture can destroy the image, whether the hologram is of the reflection or transmission type.

The copending application of Richard T. Ingwall and Herbert L. Fielding, Ser. No. 526,156, filed Aug. 24, 1983, discloses and claims photopolymerizable compositions comprising an ethylenic unsaturated monomer, preferably lithium acrylate, and a branched polyethylenine. It also is disclosed in that application that the sensitivity of the developed hologram to humidity may be substantially reduced by treating it with a zirconium compound. While this treatment is indeed beneficial, there are situations when greater resistance to humidity would be desirable.

For convenience, the disclosure of said Ser. No. 526,156 is hereby incorporated herein by reference.

SUMMARY OF THE INVENTION

In accordance with the present invention, a volume phase hologram prepared by photoexposing a photopolymerizable composition containing an ethylenic unsaturated monomer is treated with a zirconium compound, e.g., zirconium acetate, zirconyl nitrate or zirconyl chloride, followed by treatment with a fatty acid. In the preferred embodiments, the fatty acid is stearic acid.

DETAILED DESCRIPTION OF THE INVENTION

It has been found that such a sequential treatment substantially increases the resistance of the hologram to loss of diffraction efficiency and other changes induced by exposure to high humidity.

While applicant does not wish to be bound by any theory, it is believed that the fatty acid reacts with the zirconium to form a product of the type referred to in the literature as a zirconium soap.

The particular acid employed does not appear to be critical, and beneficial effects have been obtained with typical fatty acids, e.g., stearic, lauric, palmitic, myristic and oleic acids. Monocarboxylic acids as short as three and four carbons have been reported to give water-insoluble zirconium compounds. While such shorter chain acids may be considered to be fatty acids for the purposes of this invention since they give hydrophobic zirconium salts, it is preferred to use acids having longer alkyl chains, e.g., at least eight carbons, to obtain the extra hydrophobicity. The fatty acid preferably is employed as a solution in an organic solvent, e.g., isopropanol or xylene.

The quantity of zirconium and fatty acid incorporated in the hologram is not critical, provided that it is sufficient to be effective in increasing the stability of the hologram to humidity.

While the preferred polymerizable monomer is lithium acrylate, the use of this monomer is not critical. Any polymerizable monomer may be used which is capable of reacting with zirconium acetate.

The following examples are given for the purpose of illustration and are not intended to be limiting.

EXAMPLE 1

A photopolymerizable composition similar to that used in Example 4 of the aforesaid Ser. No. 526,156 and comprising acrylic acid, lithium acrylate, poly-N-vinyl pyrrolidone, methylene blue, methylene bisacrylamide and Corcat P-600 branched polyethylenimine (Cordova Chemical Co. of Michigan, North Muskegon, Michigan; molecular weight 40–60,000) was spin coated on to a 2 inch square glass slide cover to a dry thickness of about 5 microns. This slide was incubated at about 51% R.H. to activate it prior to being imaged with a He:Ne laser to provide a transmission holographic grating. The laser-exposed slide then was given a white light flood exposure and then soaked for about a minute in a solution of 10% zirconium acetate, 4% acetic acid, 20% water and 66% methanol, rinsed in 2-propanol and then soaked for 5 minutes in isopropanol containing 5% stearic acid. After rinsing in isopropanol and drying over isopropanol vapors, the hologram exhibited greatly improved water resistance and retained its image even when immersed in water. The treated hologram also had improved abrasion resistance. There was no apparent change in the optical properties of the hologram.

EXAMPLE 2

A series of transmission holographic gratings were prepared as described in Example 1 through the step of treating with zirconium acetate and rinsing. The thus-treated slides were soaked in 5% solutions of a fatty acid for 20 minutes at room temperature, washed in isopropanol and dried over isopropanol vapors. The diffraction efficiency of each slide was measured before and after the fatty acid treatment, and again 24 and 48 hours after the fatty acid treated slides were held at 95% R.H. at room temperature. A control slide was given the zirconium acetate treatment but not the fatty acid treatment. The following results were obtained:

| Fatty Acid | % Diffraction Efficiency | | | |
|---|---|---|---|---|
| | Initial | After Fatty Acid | 24 hr 95% RH | 48 hr 95% RH |
| Stearic | 84 | 75 | 82 | 77 |
| Lauric | 84 | 72 | 78 | 77 |
| Palmitic | 80 | 72 | 72 | 72 |
| Myristic | 77 | 72 | 75 | 77 |
| Oleic | 77 | 69 | 75 | 77 |
| Control | 73 | — | 4 | 2 |
| Stearic plus | 84 | 77 | 78 | 77 |

-continued

| Fatty Acid | % Diffraction Efficiency | | |
|---|---|---|---|
| | Initial | After Fatty Acid | 24 hr 95% RH | 48 hr 95% RH |
| 0.1% Corfax 712 | | | | |

(Corfax 712 is a surfactant based on a low molecular weight polyethylenimine attached to a long chain hydrocarbon, and is commercially available from Cordova Chemical Co. of Michigan, North Muskegon, Michigan. It is said to have a molecular weight of 486.).

EXAMPLE 3

Another set of transmission holographic gratings were prepared as described in Example 2. Instead of being treated with a xylene solution of a fatty acid, these holograms were treated for 10 minutes in boiling 5% xylene solution of fatty acid and then allowed to cool in the fatty acid solution for 10 minutes. The following results were obtained in the same type of incubation study:

| Fatty Acid | % Diffraction Efficiency | | | |
|---|---|---|---|---|
| | Initial | After Fatty Acid | 24 hr 95% RH | 48 hr 95% RH |
| Stearic | 80 | 75 | 78 | 80 |
| Lauric | 80 | 75 | 78 | 77 |
| Palmitic | 80 | 75 | 78 | 77 |
| Myristic | 73 | 69 | 72 | 75 |
| Oleic | 80 | 75 | 82 | 77 |
| Stearic plus 0.05% Corfax 712 | 73 | 72 | 75 | 75 |

EXAMPLE 4

A series of reflection holograms were prepared by the procedure described in Example 2 and soaked for 20 minutes at room temperature in 5% xylene solutions of oleic, lauric, stearic, palmitic and myristic acids. The treated holograms and an untreated control reflection hologram were incubated for 24 hrs. at 95% R.H. Transmission spectra showed a shift in the transmission minimum to the blue region after 24 hrs., but with no further shift with time. The diffraction efficiency of the treated holograms, as inferred from the percent transmission at the minimum of each spectrum, was substantially unchanged after incubation, whereas the control hologram was almost completely destroyed.

Where desired, additional protection against humidity may be provided by bonding the zirconium acetate/fatty acid treated hologram to a glass cover.

While the invention has been described in detail and with reference to specific embodiments thereof, it will be apparent to one skilled in the art that various changes and modifications can be made therein without departing from the spirit and scope thereof.

What is claimed is:

1. A volume phase hologram comprising a polymerized ethylenic unsaturated monomer and the reaction product of zirconium with a fatty acid, said reaction product being present in said hologram in a concentration effective to increase the resistance of the hologram to changes induced by exposure to high humidity.

2. A volume phase hologram as defined in claim 1 wherein said monomer is a salt of acrylic acid.

3. A volume phase hologram as defined in claim 2 wherein said monomer is lithium acrylate.

4. A volume phase hologram as defined in claim 3 wherein said hologram includes a branched polyethylenimine.

5. A hologram as defined in claim 1 wherein said fatty acid is stearic, lauric, palmitic, myristic or oleic acid.

6. The method of increasing the resistance to high humidity of a volume phase hologram formed by photopolymerizing an ethylenic unsaturated monomer comprising contacting said hologram with a solution of zirconium compound for a period of time sufficient for said hologram to take up a quantity of said zirconium compound and thereafter contacting said zirconium-containing hologram with a fatty acid for a period of time sufficient to form the reaction product of zirconium with said fatty acid, the concentration of said reaction product being sufficient to increase the resistance of said hologram to changes induced by exposure to high humidity.

7. The method as defined in claim 6 wherein said monomer is a salt of acrylic acid.

8. The method as defined in claim 7 wherein said monomer is lithium acrylate.

9. The method as defined in claim 6 wherein said hologram includes a branched polyethylenimine.

10. The method as defined in claim 6 wherein said fatty acid is stearic, lauric, palmitic, myristic or oleic acid.

* * * * *